(12) United States Patent
Wu et al.

(10) Patent No.: US 9,276,025 B2
(45) Date of Patent: Mar. 1, 2016

(54) ACTIVE MATRIX IMAGE SENSING PANEL AND APPARATUS

(71) Applicants: INNOCOM TECHNOLOGY (SHENZHEN) CO., LTD, Shenzhen, Guangdong Province (CN); InnoLux Corporation, Jhu-Nan, Miao-Li County (TW)

(72) Inventors: Chih-Hao Wu, Jhu-Nan (TW); Cheng-Hsu Chou, Jhu-Nan (TW)

(73) Assignees: INNOCOM TECHNOLOGY (SHENZHEN) CO., LTD, Shenzhen, Guangdong Province (CN); INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 14/166,357

(22) Filed: Jan. 28, 2014

(65) Prior Publication Data

US 2014/0217399 A1    Aug. 7, 2014

(30) Foreign Application Priority Data

Feb. 5, 2013    (TW) .............................. 102104429 A

(51) Int. Cl.
*H01L 27/146*    (2006.01)
*G06F 1/16*    (2006.01)

(52) U.S. Cl.
CPC .... *H01L 27/14603* (2013.01); *H01L 27/14609* (2013.01); *H01L 27/14663* (2013.01); *G06F 1/1626* (2013.01); *H01L 27/14665* (2013.01)

(58) Field of Classification Search
USPC ......................................................... 257/431
See application file for complete search history.

(56) References Cited

U.S. PATENT DOCUMENTS

| | | | | |
|---|---|---|---|---|
| 2010/0007632 | A1* | 1/2010 | Yamazaki | 345/175 |
| 2010/0301325 | A1* | 12/2010 | Bae et al. | 257/43 |
| 2011/0109599 | A1* | 5/2011 | Han | 345/204 |

* cited by examiner

*Primary Examiner* — Kyoung Lee
*Assistant Examiner* — Ratisha Mehta
(74) *Attorney, Agent, or Firm* — Muncy, Geissler, Olds & Lowe, P.C.

(57) ABSTRACT

An active matrix image sensing panel comprises a substrate and an image sensing pixel. The image sensing pixel is disposed on the substrate and comprises a scan line, a data line crossing the scan line, a photo sensing element and a TFT element. The photo sensing element includes a first terminal electrode and a second terminal electrode, and the voltage of the first terminal electrode is higher than that of the second terminal electrode. The TFT element includes a first electrode, a second electrode, a first gate electrode and a second gate electrode. The first electrode is electrically connected to the data line, the second electrode is electrically connected to the first terminal electrode, the first gate electrode is electrically connected to the scan line, and the second gate electrode is electrically connected to the first or second terminal electrode. An active matrix image sensing apparatus is also disclosed.

18 Claims, 8 Drawing Sheets

ACTIVE MATRIX IMAGE SENSING PANEL AND APPARATUS

CROSS REFERENCE TO RELATED APPLICATIONS

This Non-provisional application claims priority under 35 U.S.C. §119(a) on Patent Application No(s). 102104429 filed in Taiwan, Republic of China on Feb. 5, 2013, the entire contents of which are hereby incorporated by reference.

BACKGROUND OF THE INVENTION

1. Field of Invention

The invention relates to an image sensing panel and apparatus and, in particular, to an active matrix image sensing panel and apparatus.

2. Related Art

In the conventional X-ray imaging technology, images are produced by applying X-ray exposure to photographic film. In recent years, however, with the well development of semiconductor technology, X-ray imaging is improved to the so-called digital radiography (DR) technology that uses a flat and digital image sensing panel to produce images.

The principle of the digital radiography technology is briefly illustrated as below. When X-ray enters into an image sensing apparatus, a scintillator will convert X-ray into visible light that is then sensed by photo sensors and thus converted into electric signals read out by data lines through thin-film transistors (TFT), and the images will be produced after the electric signals are processed. As for the current DR technology, the photo sensor is improved to a silicon-based photodiode from a charge coupled device (CCD), and also, X-ray can be directly converted into electric signals without the scintillator.

In general, a commonly-used TFT device is such as a metal oxide TFT, and a commonly-used photo sensor is such as an NIP amorphous silicon (a-Si) photodiode. The gate electrode of the metal oxide TFT is generally operated by a voltage of negative polarity (e.g. −5V), and the bias polarity of the NIP a-Si photodiode is also negative polarity. Therefore, the electrons generated by the photo sensor due to the illumination will move towards the bottom electrode of the photo sensor, so that the levels of the bottom electrode and the source electrode of the TFT will drop off. However, if the levels of the bottom electrode and the source electrode of the TFT continuously descend because of the illumination of high-intensity light, the voltage difference between the gate and source electrodes will continuously ascend. Accordingly, when the voltage difference exceeds the threshold voltage of the TFT, the TFT will be turned on and thus the source electrode starts to leak electricity to the data line. Therefore, the image produced by the processing of the image processing module will be distorted.

Therefore, it is an important subject to provide an active matrix image sensing panel and apparatus that can prevent the leakage current problem to keep the image sensing undistorted.

SUMMARY OF THE INVENTION

In view of the foregoing subject, an objective of the invention is to provide an active matrix image sensing panel and apparatus that can prevent the leakage current problem to keep the image sensing undistorted.

To achieve the above objective, an active matrix image sensing panel according to the invention comprises a substrate and an image sensing pixel. The image sensing pixel is disposed on the substrate and comprises a scan line, a data line crossing the scan line, a photo sensing element and a thin-film transistor (TFT) element. The photo sensing element includes a first terminal electrode and a second terminal electrode, and the voltage of the first terminal electrode is higher than that of the second terminal electrode. The TFT element includes a first electrode, a second electrode, a first gate electrode and a second gate electrode. The first electrode is electrically connected to the data line, the second electrode is electrically connected to the first terminal electrode of the photo sensing element, the first gate electrode is electrically connected to the scan line, and the second gate electrode is electrically connected to the first terminal electrode or second terminal electrode of the photo sensing element.

To achieve the above objective, an active matrix image sensing apparatus according to the invention comprises an active matrix image sensing panel and a processing module. The active matrix image sensing panel includes a substrate and an image sensing pixel. The image sensing pixel is disposed on the substrate and comprises a scan line, a data line crossing the scan line, a photo sensing element and a thin-film transistor (TFT) element. The photo sensing element includes a first terminal electrode and a second terminal electrode, and the voltage of the first terminal electrode is higher than that of the second terminal electrode. The TFT element includes a first electrode, a second electrode, a first gate electrode and a second gate electrode. The first electrode is electrically connected to the data line, the second electrode is electrically connected to the first terminal electrode of the photo sensing element, the first gate electrode is electrically connected to the scan line, and the second gate electrode is electrically connected to the first terminal electrode or second terminal electrode of the photo sensing element. The processing module is electrically connected to the scan lines and data lines of the active matrix image sensing panel.

In one embodiment, the second terminal electrode is electrically connected to a reference voltage, and the reference voltage has a negative polarity.

In one embodiment, the photo sensing element further includes a first semiconductor layer, an intrinsic semiconductor layer and a second semiconductor layer, and the intrinsic semiconductor layer is disposed between the first semiconductor layer and the second semiconductor layer.

In one embodiment, the first semiconductor layer and the second terminal electrode contact each other so as to electrically connect to each other, and the second semiconductor layer and the first terminal electrode contact each other so as to electrically connect to each other.

In one embodiment, the TFT element further includes a channel layer including an oxide semiconductor, the oxide semiconductor includes an oxide, and the oxide includes at least one of indium, zinc and tin.

In one embodiment, the second gate electrode is electrically connected to the second terminal electrode through a conductive layer.

In one embodiment, the second gate electrode extends from over the TFT element to over the photo sensing element and contacts the second terminal electrode directly.

In one embodiment, the second gate electrode and the first terminal electrode are the same layer, and at least a portion of the first terminal electrode extends from the photo sensing element to over the TFT element.

In one embodiment, at least a portion of the first terminal electrode extends from the photo sensing element to over the TFT element and contacts the second gate electrode directly.

As mentioned above, for the active matrix image sensing panel and apparatus according to the invention, the first electrode of the TFT element is electrically connected to the data line, the second electrode of the TFT element is electrically connected to the first terminal electrode of the photo sensing element, the first gate electrode of the TFT element is electrically connected to the scan line, and the second gate electrode of the TFT element is electrically connected to the first terminal electrode or second terminal electrode of the photo sensing element. Thereby, the threshold voltage of the TFT element can be increased. Therefore, although the voltage difference between the first gate electrode and the second electrode is increased when the photo sensing element is illuminated, the TFT element is still not enabled and thus the leakage current is prevented. Accordingly, the active matrix image sensing panel and apparatus of the invention can prevent the leakage current problem to keep the image sensing undistorted.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1A:
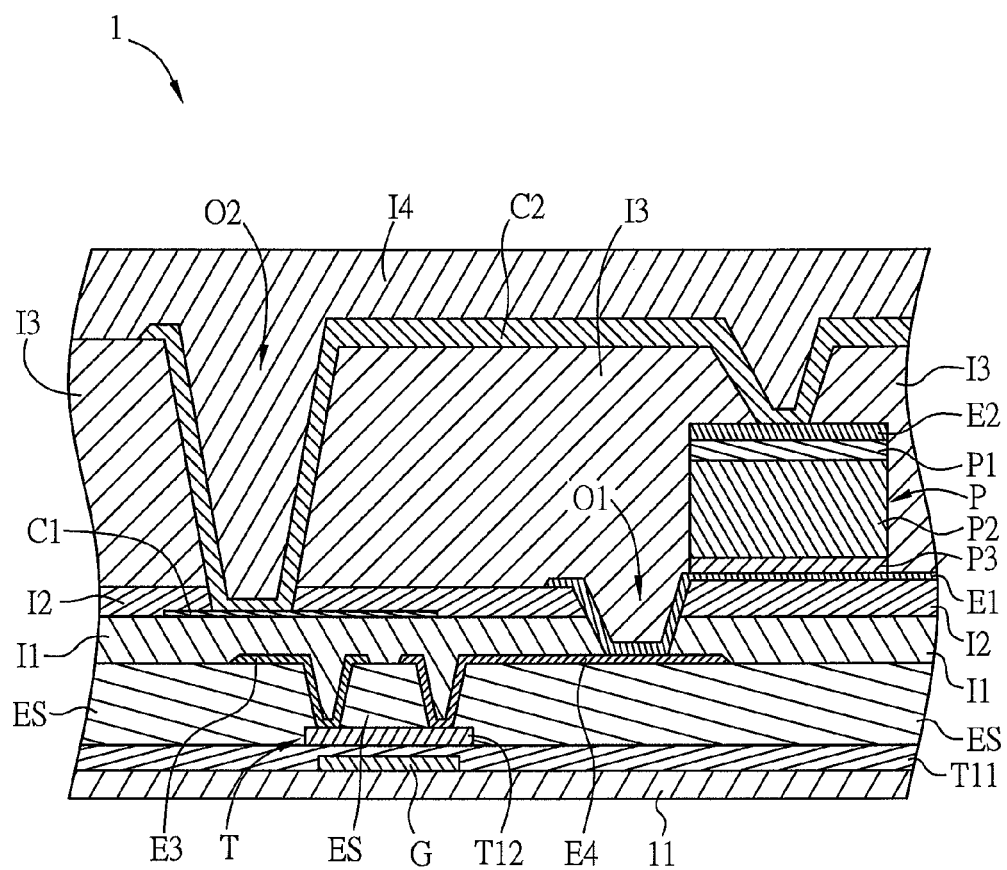
FIG. 1A is a schematic diagram of the structure of an image sensing pixel of an active matrix image sensing panel 1 according to a preferred embodiment of the invention.
Figure 1B:
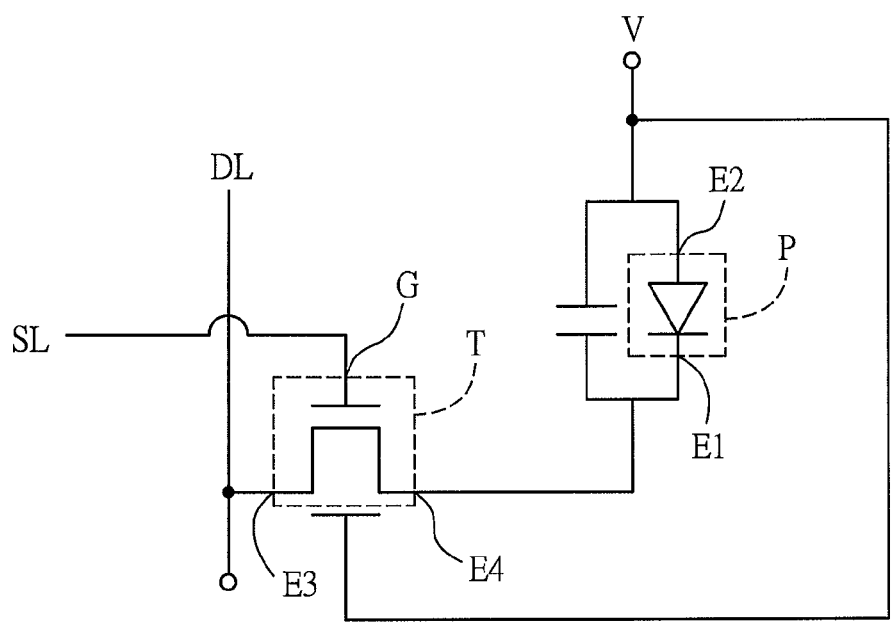
FIG. 1B is a schematic diagram of the equivalent circuit of the image sensing pixel in FIG. 1A.

FIG. 1A is a schematic diagram of the structure of an image sensing pixel of an active matrix image sensing panel 1 according to a preferred embodiment of the invention, and FIG. 1B is a schematic diagram of the equivalent circuit of the image sensing pixel in FIG. 1A.

As shown in FIGS. 1A and 1B, the active matrix image sensing panel 1 includes a plurality of image sensing pixels disposed on a substrate 11. The substrate 11 can be made by a transparent material, such as glass, quartz or the like, plastic material, rubber, fiberglass or other polymer material, for example. The substrate 11 is preferably an alumino silicate glass substrate. The substrate 11 also can be made by an opaque material, and thus can be a metal-fiberglass compound board or a metal-ceramic compound board for example.

At least one of the image sensing pixels includes a scan line SL, a data line DL, a photo sensing element P, a thin-film transistor (TFT) element T and a conductive layer C1. The image sensing pixel of this embodiment can further include a conductive layer C2, a plurality of insulation layers I1 to I3 and a protection layer I4. The scan line SL, data line DL, photo sensing element P, TFT element T, conductive layers C1 and C2, insulation layers I1 to I3 and protection layer I4 are all disposed on the substrate 11. To be noted, only one image sensing pixel is shown in FIG. 1A, but for the active matrix image sensing panel 1, it includes a plurality of image sensing pixels disposed in an array, and a plurality of data lines DL and scan lines SL crossing each other.

The data lines DL and the scan lines SL cross each other. The photo sensing element P includes a first terminal electrode E1 and a second terminal electrode E2. Each of the first and second terminal electrodes E1 and E2 can be a transparent electrode, and has indium tin oxide (ITO) as material for example. Besides, the photo sensing element P further includes a first semiconductor layer P1, an intrinsic semiconductor layer P2 and a second semiconductor layer P3, and the intrinsic semiconductor layer P2 is disposed between the first semiconductor layer P1 and the second semiconductor layer P3. The first semiconductor layer P1 and the second terminal electrode E2 contact each other so as to electrically connect to each other, and the second semiconductor layer P3 and the first terminal electrode E1 contact each other so as to electrically connect to each other. Herein, the photo sensing element P is an NIP photodiode and made by an a-Si thin film deposition process for example. In this embodiment, the first semiconductor layer is such as p-type semiconductor and the second semiconductor layer is such as n-type semiconductor. However, the invention is not limited thereto. Besides, as shown in FIG. 1B, the second terminal electrode E2 is electrically connected to a reference voltage V, and the reference voltage V can provide the photo sensing element P with a bias, which is of negative polarity. Therefore, the voltage of the first terminal electrode E1 is higher than that of the second terminal electrode E2.

The TFT element T is such as an n-type a-Si TFT including a gate electrode G, a gate dielectric layer T11, a channel layer T12, a first electrode E3 and a second electrode E4. The gate electrode G is disposed on the substrate 11 and electrically connected to the scan line SL. The gate electrode G can have metal (e.g. aluminum, copper, silver, molybdenum (Mo) or titanium) or alloy thereof as material, and can be a single-layer or multi-layer structure. Some of the conductive wires, such as scan lines, for transmitting driving signals can be the same layer and made by the same process as the gate electrode G, and the wires can be electrically connected to the gate electrode G. The gate dielectric layer T11 is disposed on the gate electrode G, and can be made by organic material such as organic silicone compound, or inorganic material such as silicon nitride, silicon oxide, silicon oxynitride, silicon carbide, aluminum oxide, hafnium oxide or any of combinations thereof. The gate dielectric layer T1 can be a single-layer or multi-layer structure. The gate dielectric layer T1 needs to completely cover the gate electrode G, and can cover the partial or whole substrate 11.

The channel layer T12 is disposed opposite the gate electrode G and on the gate dielectric layer T11. As an embodiment, the material of the channel layer T12 can include an oxide semiconductor for example, and the oxide semiconductor includes an oxide, which includes at least one of indium, gallium, zinc and tin for example. The oxide semiconductor is, for example but not limited to, indium gallium zinc oxide (IGZO), so that the TFT element T is a metal oxide TFT. The metal oxide TFT features a low leakage current (from 10~14 A to 10~18 A), a wide electronic bandgap (about 3.1 eV), and insensitivity to illumination, being an enhancement mode TFT.

The first electrode E3 and the second electrode E4 are disposed on the channel layer T12, and both contact the channel layer T12. When the channel layer T12 of the TFT element T is not enabled, the first and second electrodes E3 and E4 are separated electrically. The first electrode E3 is such as the drain electrode of the TFT element T and electrically connected to the data line DL, and the second electrode E4 is such as the source electrode of the TFT element T and electrically connected to the first terminal electrode E1 of the photo sensing element P. Herein, the first terminal electrode E1 and the second electrode E4 are electrically connected to each other via a through hole O1 disposed at the insulation layers I1 and I2 and the first terminal electrode E1 extending towards the TFT element T. The material of each of the first and second electrodes E3 and E4 can include metal (e.g. aluminum, copper, silver, molybdenum or titanium) or alloy thereof, and the first and second electrodes E3 and E4 can be a single-layer or multi-layer structure each. Besides, some of the conductive wires, such as data lines, for transmitting driving signals can be the same layer and made by the same process as the first and second electrodes E3 and E4.

To be noted, the first electrode E3 (also called the source electrode hereinafter) and the second electrode E4 (also called the drain electrode hereinafter) also can be disposed on an etch stop layer ES, and respectively contact the channel layer T12 through the openings of the etch stop layer ES. The etch stop layer ES can be made by organic material such as organic silicone compound, or inorganic material such as silicon nitride, silicon oxide, silicon oxynitride, silicon carbide, aluminum oxide, hafnium oxide or any of combinations thereof. The etch stop layer ES can be a single-layer or multi-layer structure. In other embodiments, the source and the drain can be directly disposed on the channel layer T12 instead of through the etch stop layer ES.

The conductive layer C1 is disposed opposite the gate electrode G, and is electrically connected to the first terminal electrode E1 or second terminal electrode E2 of the photo sensing element P. In this embodiment, the conductive layer C1 is disposed over the gate electrode G. The gate electrode G is called the first gate electrode of the TFT element T while the conductive layer C1 is called the second gate electrode of the TFT element T. Moreover, the first gate electrode (gate electrode G) and the second gate electrode (conductive layer C1) are disposed oppositely, and the insulation layer I1 is disposed between the conductive layer C1 (second gate electrode) and the first electrode E3 or second electrode E4. Besides, the insulation layer I2 covers at least a portion of the conductive layer C1, and the insulation layer I3 is disposed on the insulation layer I2. The conductive layer C1 (second gate electrode) and the second terminal electrode E2 are electrically connected to each other via a through hole O2 disposed at the insulation layers I2 and I3 and by the conductive layer C2 extending from the through hole O2 to the second terminal electrode E2. The conductive layer C2 also can be electrically connected to the reference voltage V to provide the photo sensing element P with a bias (not shown in FIG. 1A). The conductive layers C1 and C2 can be made by transparent material (such as ITO) or opaque material (such as metal or alloy). Herein, the conductive layer C1 is a metal layer, and the conductive layer C2 is a transparent conductive layer, for example. The material of the insulation layer I1 is such as SiOx, the material of the insulation layer I2 is such as SiNx, and the material of the insulation layer I3 includes SiNx or Siloxane for example. The protection layer I4 is disposed over the TFT element T and the photo sensing element P and on the conductive layer C2 and the insulation layer I3. Herein, the material of the protection layer I4 can be the same as that of the insulation layer I3, and, for example, includes SiNx or Siloxane.

Figure 2:
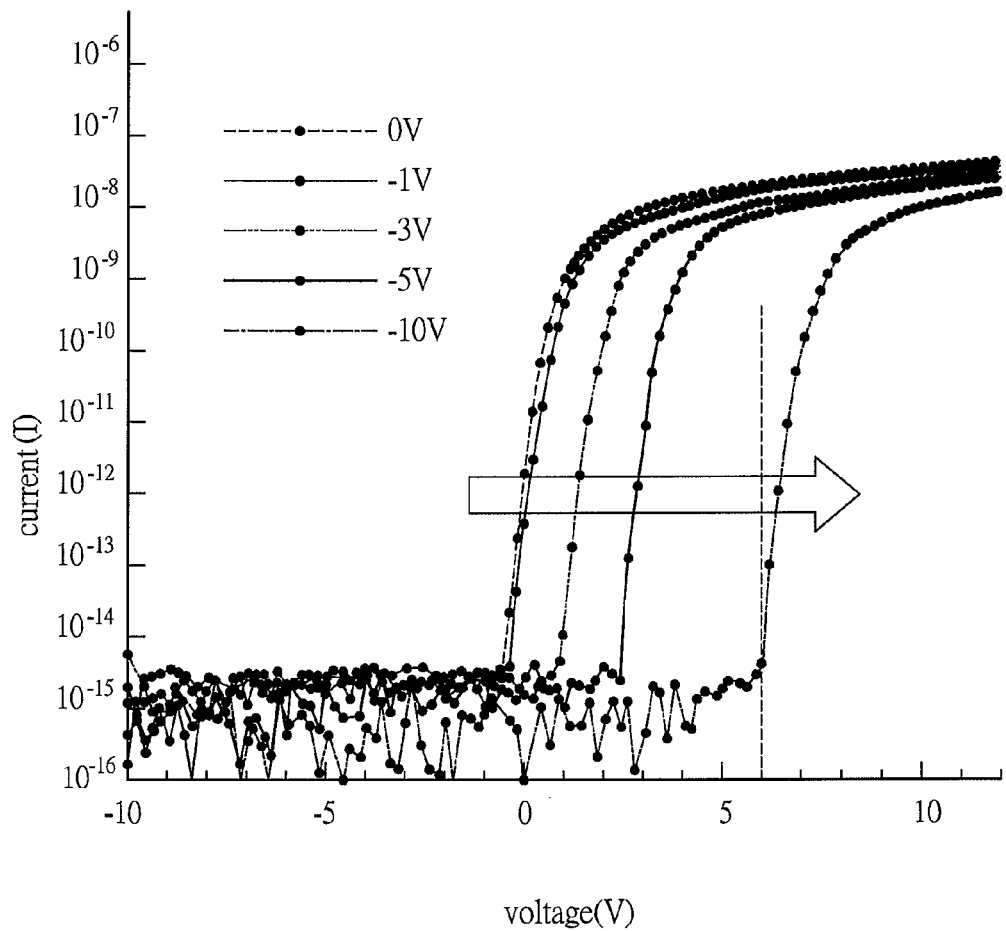
FIG. 2 is a schematic diagram showing the current-voltage curve of the TFT element in the active matrix image sensing panel according to the invention.

FIG. 2 is a schematic diagram showing the current-voltage curve of the TFT element T in the active matrix image sensing panel 1 according to the invention. Herein, the abscissa of FIG. 2 represents the voltage of the gate electrode G (first gate electrode) and the ordinate represents the normalized drain current.

In this embodiment, the conductive layer C1 (second gate electrode) is disposed over the gate electrode G (first gate electrode) and electrically connected to the second terminal electrode E2 of the photo sensing element P, and the second terminal electrode E2 is electrically connected to the reference voltage V which is the bias of the photo sensing element P with negative polarity. Therefore, the voltage of the first terminal electrode E1 is higher than that of the second terminal electrode E2. By the conductive layer C1 (second gate electrode) with negative polarity, the accumulated electrons exist in the back channel (i.e. between the channel layer T12 and the etch stop layer ES) of the channel layer T12 of the TFT element T can be guided out, and thereby the threshold voltage of the TFT element T can be increased. Herein, it can be considered that the TFT element T has a dual-gate design (to be noted, the conductive layer C1 and the gate electrode G actually have different function) so that the threshold voltage of the TFT element T can be increased by the conductive layer C1.

As shown in FIG. 2, when the voltage of the conductive layer C1 electrically connected to the reference voltage V of negative polarity diminishes more and more (e.g. 0, −1V, . . . , −10V), the current (drain)-voltage (gate) curve of the TFT element T will be shifted rightward, and accordingly the threshold voltage of the TFT element T is increased (e.g. from nearly 0V to nearly 6V). For example, when the reference voltage V is −10V, the voltage of the conductive layer C1 electrically connected to the reference voltage V is also −10V, and accordingly the threshold voltage of the TFT element T is raised to +6V or more. Therefore, although the level of the second electrode E4 of the TFT element T descends and thus the voltage difference VGS between the gate electrode G and the second electrode E4 (source electrode) ascends (i.e. the absolute value of VGA becomes less) when the electrons generated by the photo sensing element P due to the illumination move towards the first terminal electrode E1 and the second electrode E4 of the TFT element T, the TFT element T will not be enabled because the threshold voltage of the TFT element T has been increased due to the conductive layer C1. Therefore, the leakage current problem will not occur in the TFT element T.

The active matrix image sensing panel 1 can further include a wavelength modulation layer (not shown), which is disposed over the image sensing pixel. The wavelength modulation layer can be a scintillator for converting the received light into the light of a certain wavelength. For example, X-ray is converted into the visible light which can be sensed by the photo sensing element P. Otherwise, the wavelength modulation layer can be removed when the photo sensing element P can directly convert X-ray into the electric signals.

Figure 3:
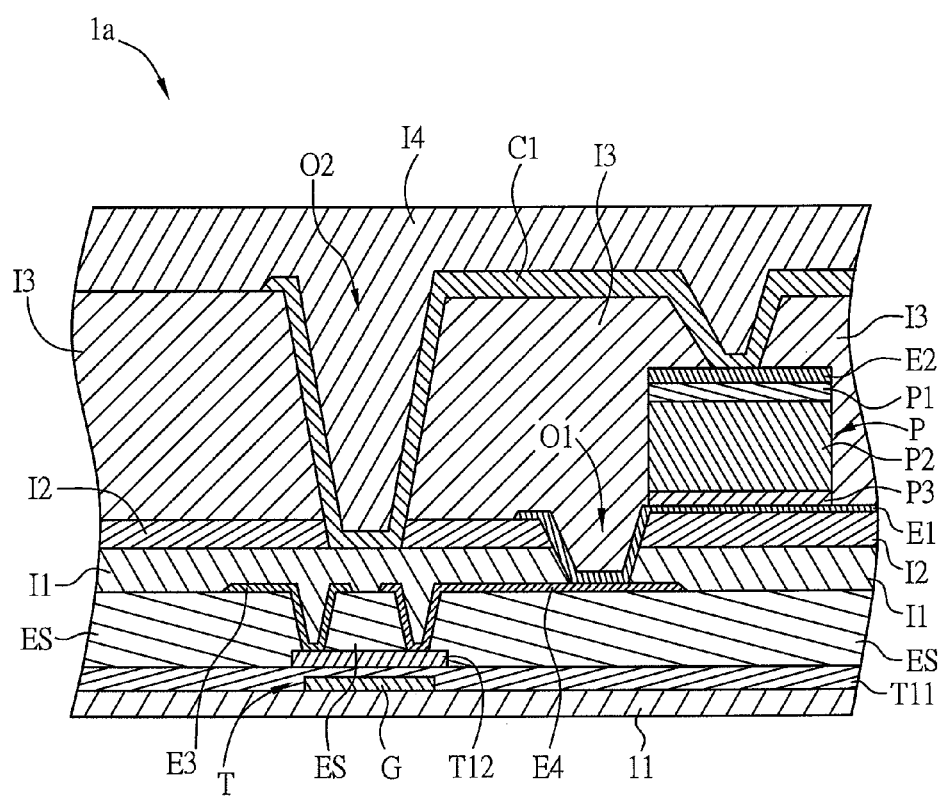
FIG. 3 is a schematic diagram of the structure of an image sensing pixel of another active matrix image sensing panel according to the preferred embodiment of the invention.

FIG. 3 is a schematic diagram of the structure of an image sensing pixel of another active matrix image sensing panel 1a according to the preferred embodiment of the invention.

Mainly different from the case of FIG. 1A, the conductive layer C1 in FIG. 3 directly extends from over the TFT element T to the photo sensing element P and contacts the second terminal electrode E2 so as to be electrically connected to the second terminal electrode E2, instead of through another conductive layer. In other words, the through hole O2 is formed at the insulation layers I2 and I3, and the conductive layer C1 is disposed in the through hole O2 so as to extend from over the TFT element T to the photo sensing element P for contacting the second terminal electrode E2 to achieve the mutual electrical connection. The conductive layer C1 can be made by a transparent material, such as ITO.

Figure 4A:
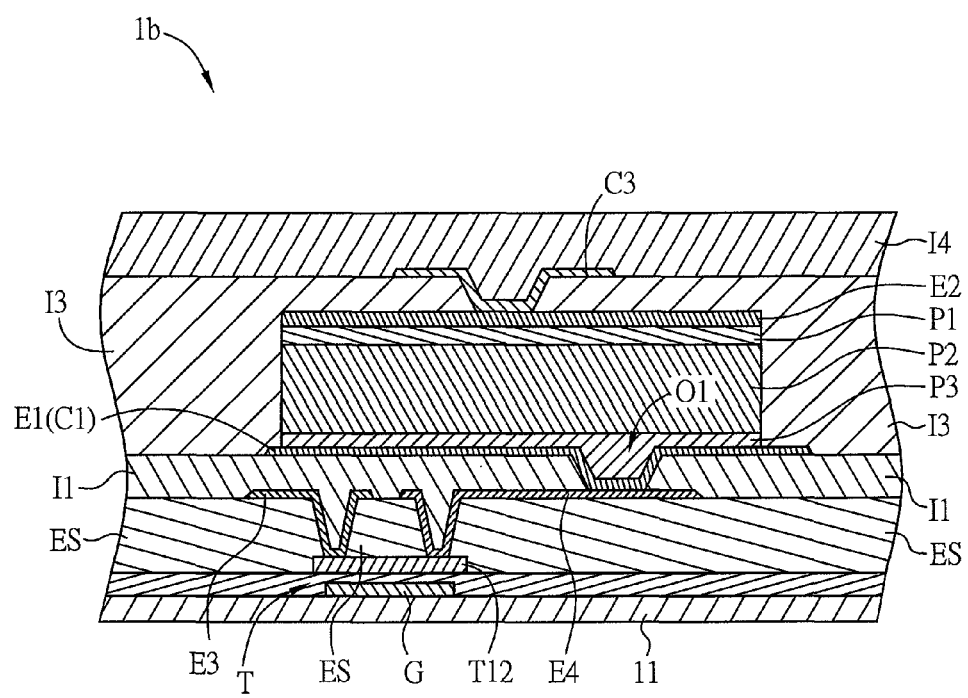
FIG. 4A is a schematic diagram of the structure of an image sensing pixel of another active matrix image sensing panel according to the preferred embodiment of the invention.
Figure 4B:
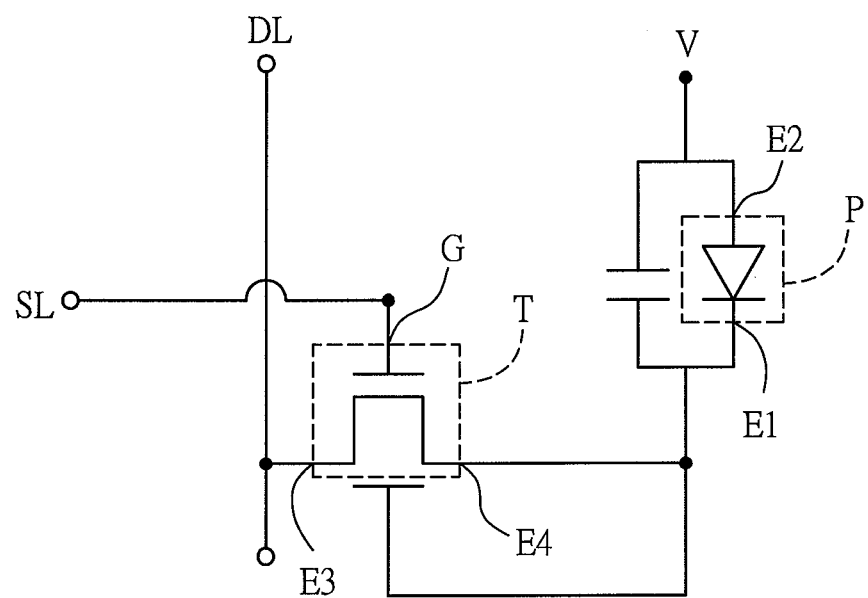
FIG. 4B is a schematic diagram of the equivalent circuit of the image sensing pixel in FIG. 4A.

FIG. 4A is a schematic diagram of the structure of an image sensing pixel of another active matrix image sensing panel 1b according to the preferred embodiment of the invention, and FIG. 4B is a schematic diagram of the equivalent circuit of the image sensing pixel in FIG. 4A.

Mainly different from the cases of FIGS. 1A and 1B, for the active matrix image sensing panel 1b in FIGS. 4A and 4B, the conductive layer C1 is the same layer as the first terminal electrode E1, so that they are electrically connected to each other. In other words, the first terminal electrode E1 extends from the photo sensing element P to over the TFT element T so that the first terminal electrode E1 can be regarded as the conductive layer of the TFT element T (i.e. the original conductive layer is omitted). Accordingly, the photo sensing element P is disposed over the TFT element T. Besides, another conductive layer C3 is disposed on the photo sensing element P and electrically connected to the reference voltage V to provide the bias for the photo sensing element P. In other embodiments, just the first terminal electrode E1 is extended to over the TFT element T while the other portion of the photo sensing element P is not disposed over the TFT element T.

The photo sensing element P can be excited to generate electron-hole pairs by the received light, and meanwhile, a bias of negative polarity from the reference voltage V is applied to the photo sensing element P to cause the separation of the electron-hole pairs. Therefore, when the electrons generated by the photo sensing element P receiving the light move towards the first terminal electrode E1 of the photo sensing element P, the level of the first terminal electrode E1 and the second electrode E4 of the TFT element T will drop off. Accordingly, the drop-off level (voltage of negative polarity) of the first terminal electrode E1 of the photo sensing element P caused by the illumination is directly applied to the conductive layer C1 (actually, the conductive layer C1 and the first terminal electrode E1 are the same layer) disposed over the TFT element T, so that the TFT element T is provided with the voltage of negative polarity dynamically. Thereby, the current (drain)-voltage (gate) curve of the TFT element T can be shifted rightward. Therefore, the threshold voltage of the TFT element T is increased, and thus the TFT element T will not be enabled and the leakage current can be prevented.

Figure 4C:
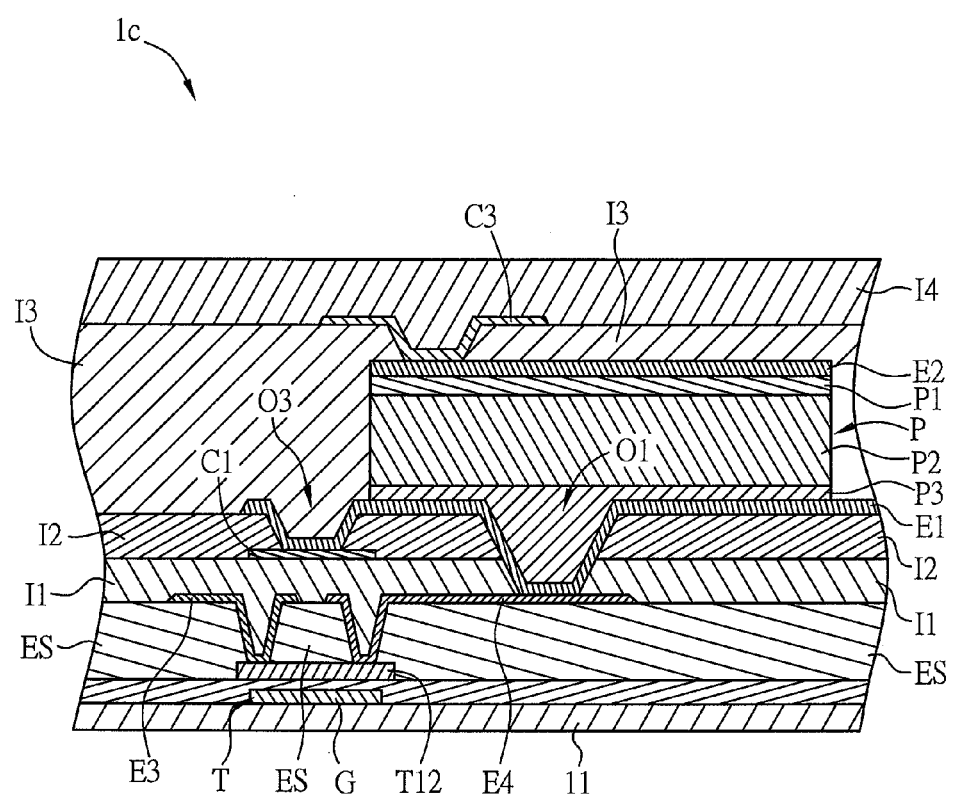
FIG. 4C is a schematic diagram of the structure of an image sensing pixel of another active matrix image sensing panel according to the preferred embodiment of the invention.

FIG. 4C is a schematic diagram of the structure of an image sensing pixel of another active matrix image sensing panel 1c according to the preferred embodiment of the invention.

Mainly different from the case of FIG. 4A, for the active matrix image sensing panel 1c, a portion of the first terminal electrode E1 extends to over the TFT element T and contacts the conductive layer C1 to achieve the mutual electrical connection. In other words, by the first terminal electrode E1 disposed at a through hole O3, the first terminal electrode E1 and the conductive layer C1 (second gate electrode) are electrically connected to each other. Thereby, when the photo sensing element P is illuminated, the TFT element T also can be provided with the voltage of negative polarity dynamically. Therefore, the threshold voltage of the TFT element T is increased, and thus the TFT element T will not be enabled and the leakage current can be prevented.

Figure 5:
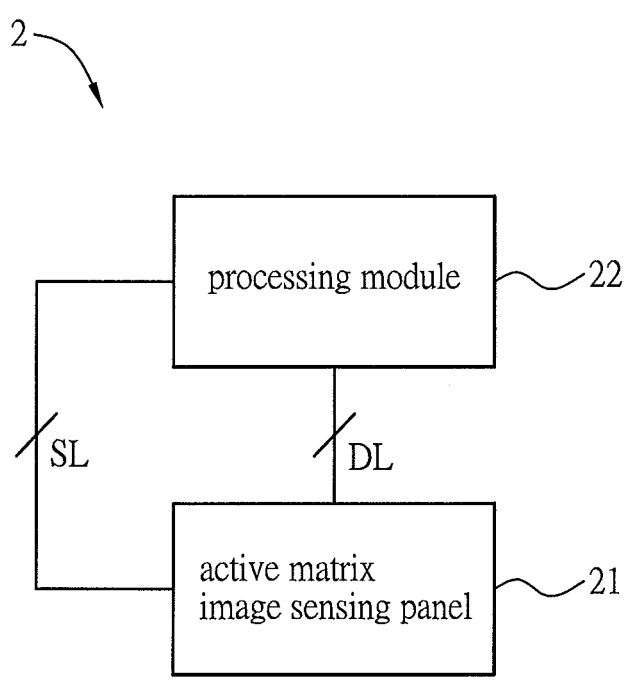
FIG. 5 is a schematic block diagram of an active matrix image sensing apparatus according to a preferred embodiment of the invention.

FIG. 5 is a schematic block diagram of an active matrix image sensing apparatus 2 according to a preferred embodiment of the invention.

The active matrix image sensing apparatus 2 includes an active matrix image sensing panel 21 and a processing module 22. The active matrix image sensing panel 21 is electrically connected to the processing module 22, and can be one of the active matrix image sensing panels 1~1c, and therefore it is not described here for conciseness.

The processing module 22 is electrically connected to the data lines DL of the active matrix image sensing panel 21, and receives the photo sensing signals of the photo sensing elements of the active matrix image sensing panel 21 to produce an image data. The image data can be treated by a subsequent image processing and then displayed. Besides, the processing module 22 is also electrically connected to the scan lines SL of the active matrix image sensing panel 21, and can sequentially enable the scan lines SL to read out the photo sensing signals.

In summary, for the active matrix image sensing panel and apparatus according to the invention, the first electrode of the TFT element is electrically connected to the data line, the second electrode of the TFT element is electrically connected to the first terminal electrode of the photo sensing element, the first gate electrode of the TFT element is electrically connected to the scan line, and the second gate electrode of the TFT element is electrically connected to the first terminal electrode or second terminal electrode of the photo sensing element. Thereby, the threshold voltage of the TFT element can be increased. Therefore, although the voltage difference between the first gate electrode and the second electrode is increased when the photo sensing element is illuminated, the TFT element is still not enabled and thus the leakage current is prevented. Accordingly, the active matrix image sensing panel and apparatus of the invention can prevent the leakage current problem to keep the image sensing undistorted.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An active matrix image sensing panel, comprising:
  a substrate; and
  an image sensing pixel disposed on the substrate and comprising:
   a scan line;
   a data line crossing the scan line;
   a photo sensing element including a first terminal electrode and a second terminal electrode, wherein the voltage of the first terminal electrode is higher than that of the second terminal electrode, and the first terminal electrode overlaps the second terminal electrode; and
   a thin-film transistor (TFT) element including a first electrode, a second electrode, a first gate electrode and a second gate electrode, wherein the first electrode is electrically connected to the data line, the second electrode is electrically connected to the first terminal electrode of the photo sensing element, the first gate electrode is electrically connected to the scan line, and the second gate electrode is electrically connected to the first terminal electrode or second terminal electrode of the photo sensing element, wherein the first gate electrode is disposed on an upper surface of the substrate, and the second terminal electrode overlaps the first terminal electrode along a direction perpendicular to the upper surface of the substrate.

2. The active matrix image sensing panel as recited in claim 1, wherein the second terminal electrode is electrically connected to a reference voltage, and the reference voltage has a negative polarity.

3. The active matrix image sensing panel as recited in claim 1, wherein the photo sensing element further includes a first semiconductor layer, an intrinsic semiconductor layer and a second semiconductor layer, and the intrinsic semiconductor layer is disposed between the first semiconductor layer and the second semiconductor layer.

4. The active matrix image sensing panel as recited in claim 3, wherein the first semiconductor layer and the second terminal electrode electrically connect to each other, and the second semiconductor layer and the first terminal electrode electrically connect to each other.

5. The active matrix image sensing panel as recited in claim 1, wherein the TFT element further includes a channel layer including an oxide semiconductor, the oxide semiconductor includes an oxide, and the oxide includes at least one of indium, zinc and tin.

6. The active matrix image sensing panel as recited in claim 1, wherein the second gate electrode is electrically connected to the second terminal electrode through a conductive layer.

7. The active matrix image sensing panel as recited in claim 1, wherein the second gate electrode extends from over the TFT element to over the photo sensing element and contacts the second terminal electrode directly.

8. The active matrix image sensing panel as recited in claim 1, wherein, the second gate electrode and the first terminal electrode are the same layer, and at least a portion of the first terminal electrode extends from the photo sensing element to over the TFT element.

9. The active matrix image sensing panel as recited in claim 1, wherein at least a portion of the first terminal electrode extends from the photo sensing element to over the TFT element and contacts the second gate electrode directly.

10. An active matrix image sensing apparatus, comprising:
an active matrix image sensing panel, comprising:
a substrate; and
an image sensing pixel disposed on the substrate and comprising:
a scan line;
a data line crossing the scan line;
a photo sensing element including a first terminal electrode and a second terminal electrode, wherein the voltage of the first terminal electrode is higher than that of the second terminal electrode, and the first terminal electrode overlaps the second terminal electrode; and a thin-film transistor (TFT) element including a first electrode, a second electrode, a first gate electrode and a second gate electrode, wherein the first electrode is electrically connected to the data line, the second electrode is electrically connected to the first terminal electrode of the photo sensing element, the first gate electrode is electrically connected to the scan line, and the second gate electrode is electrically connected to the first terminal electrode or second terminal electrode of the photo sensing element; and a processing module electrically connected to the scan lines and data lines of the active matrix image sensing panel, wherein the first gate electrode is disposed on an upper surface of the substrate, and the second terminal electrode overlaps the first terminal electrode along a direction perpendicular to the upper surface of the substrate.

11. The active matrix image sensing apparatus as recited in claim 10, wherein the second terminal electrode is electrically connected to a reference voltage, and the reference voltage has a negative polarity.

12. The active matrix image sensing apparatus as recited in claim 10, wherein the photo sensing element further includes a first semiconductor layer, an intrinsic semiconductor layer and a second semiconductor layer, and the intrinsic semiconductor layer is disposed between the first semiconductor layer and the second semiconductor layer.

13. The active matrix image sensing apparatus as recited in claim 12, wherein the first semiconductor layer and the second terminal electrode electrically connect to each other, and the second semiconductor layer and the first terminal electrode electrically connect to each other.

14. The active matrix image sensing apparatus as recited in claim 10, wherein the TFT element further includes a channel layer including an oxide semiconductor, the oxide semiconductor includes an oxide, and the oxide includes at least one of indium, zinc and tin.

15. The active matrix image sensing apparatus as recited in claim 10, wherein the second gate electrode is electrically connected to the second terminal electrode through a conductive layer.

16. The active matrix image sensing apparatus as recited in claim 10, wherein the second gate electrode extends from over the TFT element to over the photo sensing element and contacts the second terminal electrode directly.

17. The active matrix image sensing apparatus as recited in claim 10, wherein the second gate electrode and the first terminal electrode are the same layer, and at least a portion of the first terminal electrode extends from the photo sensing element to over the TFT element.

18. The active matrix image sensing apparatus as recited in claim 10, wherein at least a portion of the first terminal electrode extends from the photo sensing element to over the TFT element and contacts the second gate electrode directly.

* * * * *